(12) United States Patent
Hung et al.

(10) Patent No.: US 9,349,639 B2
(45) Date of Patent: May 24, 2016

(54) METHOD FOR MANUFACTURING A CONTACT STRUCTURE USED TO ELECTRICALLY CONNECT A SEMICONDUCTOR DEVICE

(71) Applicant: UNITED MICROELECTRONICS CORP., Hsin-Chu (TW)

(72) Inventors: Ching-Wen Hung, Tainan (TW); Chih-Sen Huang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/510,100

(22) Filed: Oct. 8, 2014

(65) Prior Publication Data

US 2016/0104637 A1    Apr. 14, 2016

(51) Int. Cl.
*H01L 21/44* (2006.01)
*H01L 21/768* (2006.01)

(52) U.S. Cl.
CPC .... *H01L 21/76877* (2013.01); *H01L 21/76802* (2013.01)

(58) Field of Classification Search
CPC ............ G03F 7/70433; G03F 7/70458; G03F 7/70466; G03F 1/144; H01L 21/31144; H01L 21/76816; H01L 21/76877
See application file for complete search history.

(56) References Cited

U.S. PATENT DOCUMENTS

| | | | |
|---|---|---|---|
| 6,929,887 B1 | 8/2005 | Lin | |
| 7,142,282 B2 | 11/2006 | Borodovsky | |
| 7,887,996 B2 | 2/2011 | Liu | |
| 7,915,171 B2 | 3/2011 | Wallace | |
| 8,058,177 B2 | 11/2011 | Weiss | |
| 8,530,145 B2 | 9/2013 | Hagiwara | |
| 2007/0231748 A1 | 10/2007 | Sivakumar | |
| 2011/0217842 A1* | 9/2011 | Park | H01L 21/283 438/674 |
| 2012/0040528 A1* | 2/2012 | Kim et al. | 438/675 |
| 2012/0135341 A1 | 5/2012 | Tseng | |
| 2012/0164835 A1* | 6/2012 | Wu | H01L 21/0337 438/694 |
| 2013/0069162 A1* | 3/2013 | Lin | H01L 27/0207 257/368 |
| 2014/0300000 A1* | 10/2014 | Chao et al. | 257/774 |

OTHER PUBLICATIONS

Wu, Title of Invention: Method of forming via hole, U.S. Appl. No. 12/977,092, filed Dec. 23, 2010.
Chen, Title of Invention: Manufacturing method for forming a semiconductor structure, U.S. Appl. No. 13/902,977, filed May 27, 2013.

* cited by examiner

*Primary Examiner* — Shaun Campbell
(74) *Attorney, Agent, or Firm* — Winston Hsu; Scott Margo

(57) ABSTRACT

A method for manufacturing contact structure includes the steps of: providing a substrate having the semiconductor device and an interlayer dielectric thereon, wherein the semiconductor device includes a gate structure and a source/drain region; forming a patterned mask layer with a stripe hole on the substrate, and concurrently forming a stripe-shaped mask layer on the substrate; forming a patterned photoresist layer with a plurality of slot holes on the substrate, wherein at least one of the slot holes is disposed right above the source/drain region; and forming a contact hole in the interlayer dielectric by using the patterned mask layer, the stripe-shaped mask layer and the patterned photoresist layer as an etch mask, and the source/drain region is exposed from the bottom of the contact hole when the step of forming the contact hole is completed.

15 Claims, 5 Drawing Sheets

METHOD FOR MANUFACTURING A CONTACT STRUCTURE USED TO ELECTRICALLY CONNECT A SEMICONDUCTOR DEVICE

BACKGROUND OF THE INVENTION

1. Field of the Invention

The present invention relates generally to a method of manufacturing a contact structure in an integrated circuit, and more particularly to a method of manufacturing a contact structure in a sparse region of an integrated circuit.

2. Description of the Prior Art

Field effect transistors are important electronic devices in the fabrication of integrated circuits. As the sizes of the semiconductor devices becomes smaller and smaller, the fabrication of the transistors also has to be improved so as to fabricate transistors with smaller sizes and higher quality.

For a static random access memory (SRAM) comprised of transistors, the transistors are often electrically connected with one another through contacts and metal lines. By electrically connecting a portion of one transistor to a portion of another transistor, every six of the transistors can constitute a latch circuitry as well as a unit cell of the SRAM. Also, as the size of the SRAM continues to shrink, there is also a need to dispose contacts between the transistors and the metal lines of the SRAM, and these contacts are sometimes called $M_0$ contacts. Generally, $M_0$ contacts are formed on or above source/drain regions of the transistors and are often used to provide a short-distance electrical connection. However, because the densities of the $M_0$ contacts are varied from region to region, the resolution of the corresponding photolithographic process for manufacturing the $M_0$ contacts is often lowered by this non-uniform contact density.

Accordingly, there is still a need to provide a modified method for manufacturing contact structures, especially $M_0$ contacts, in order to overcome the above-mentioned drawbacks.

SUMMARY OF THE INVENTION

According to one embodiment of the present invention, a method for manufacturing contact structure electrically connecting a semiconductor device is disclosed and includes the steps of: providing a substrate having the semiconductor device and an interlayer dielectric thereon, wherein the semiconductor device includes a gate structure and a source/drain region; forming a patterned mask layer with a stripe hole on the substrate, and the stripe hole is disposed right above the source/drain region; concurrently forming a stripe-shaped mask layer on the substrate, and the stripe-shaped mask layer is spaced apart from the source/drain region during the step of forming the patterned mask layer; forming a patterned photoresist layer with a plurality of slot holes on the substrate, wherein at least one of the slot holes is disposed right above the source/drain region; and forming a contact hole in the interlayer dielectric by using the patterned mask layer, the stripe-shaped mask layer and the patterned photoresist layer as an etch mask. The source/drain region is exposed from the bottom of the contact hole when the step of forming the contact hole is completed.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
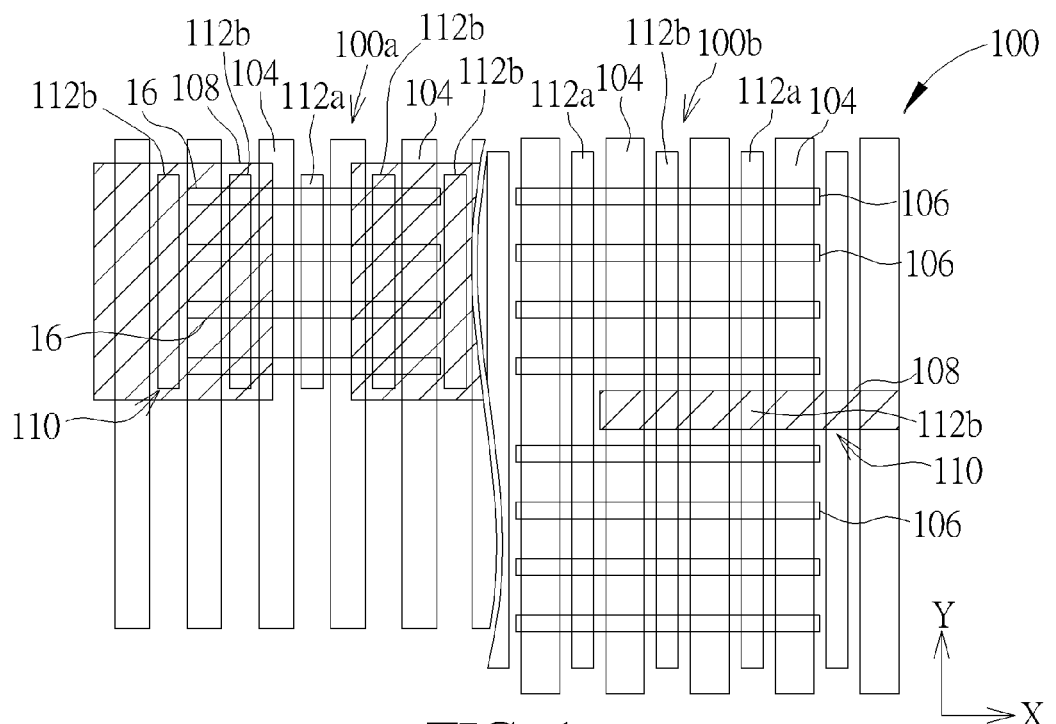
FIG. 1 is a schematic top view showing a modified design layout received by a computer readable storage device.

FIG. 1 is a schematic top view showing a modified design layout received by a computer readable storage device. As shown in FIG. 1, a modified design layout 100 includes at least two sub-layouts: sub-layout 100a and sub-layout 100b, which respectively represent the layouts used to construct structures in different regions of a semiconductor device. These sub-layouts 100a and 100b respectively include at least a plurality of fin-shaped patterns 106, a plurality of gate patterns 104, a plurality of slot contact patterns 112, and mask patterns 108. As can be seen in FIG. 1, both the gate patterns 104 and the slot contact patterns 112 are arranged in a first orientation Y, and the slot contact patterns 112 are spaced apart from the gates patterns 104. One feature of the embodiment of the present invention is that some or portions of the slot contact patterns 112 overlap the mask patterns 108. In other words, there are overlapped regions 110 between the slot contact patterns 112 and the mask patterns 108. In detail, for the sub-layouts 100a, the mask patterns 108 overlap all dummy slot contacts 112b but are spaced apart from a slot contact 112a. For the sub-layouts 100b, the mask patterns 108 overlap dummy slot contacts 112b. That is, for and 100b, the overlapped regions 110 of the sub-layouts 100a between the slot contact patterns 112 and the mask patterns 108 may include regions of entire dummy slot contacts 112b, and the overlapped regions 110 of the sub-layouts 100b may include regions between the ends of the two adjacent slot contacts 112a.

For the sake of clarity, a method for generating the above-mentioned modified design layout 100 is further disclosed in the following paragraphs. Similar to the layout shown in FIG. 1, an original design layout (not shown), including the gate patterns 104 and slot contact patterns, is provided to the computer readable storage device. The slot contact patterns at this processing stage may only include slot contact 112a. That is, the dummy slot contact 112b is not generated at this time. Afterwards, in order to increase the resolution of the subsequent photolithographic process, a plurality of dummy slot contacts 112b is generated next to the sides of the slot contact 112a or between the distal ends of two adjacent slot contacts 112a. By inserting the dummy slot contacts 112b into the original design layout, the density of the slot contact patterns 112 may become more uniform, and the resolution of the corresponding photolithographic process may therefore become higher. However, because these dummy slot contacts 112b are unnecessary components for the final semiconductor device, they should be removed once the photolithographic process for manufacturing the slot contact patterns is completed. Therefore, the mask patterns 108 overlapping all of the dummy slot contacts 112b are then generated according to the positions of the dummy slot contacts 112b. Preferably, the mask patterns 108 may include rectangle patterns or stripe patterns, and the size of the mask patterns 108 is greater than or equal to the size of the dummy slot contacts 112b according to the embodiment of the present invention.

The corresponding manufacturing method is further disclosed in the following paragraphs in order to enable persons having ordinary skill in the art to make and use the above-mentioned contact structure.

Figure 2:
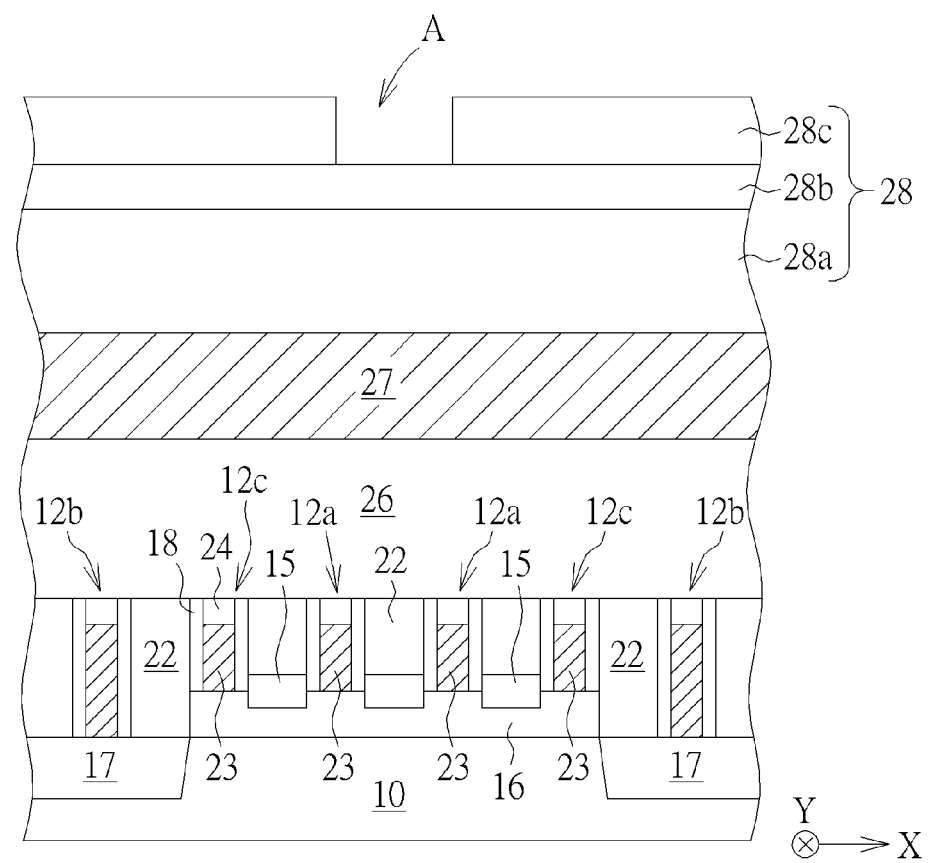
FIG. 2 is a schematic cross-section diagram of a semiconductor device at the beginning of the fabrication process.

Please refer to FIGS. 2-10, which are schematic diagrams illustrating a manufacturing method of contact structures according to a preferred embodiment of the present invention. FIG. 2 is across section diagram of a semiconductor device at the beginning of the fabrication process. As shown in FIG. 2, a substrate 10 is first provided, wherein the substrate 10 comprises a plurality of gate structures 12 arranged along a first orientation Y, and at least one fin structure 16 arranged along a second orientation X, where the gate structures 12 cross over the fin structure 16. Preferably, the first direction and second direction are orthogonal, so each fin structure 16 and each gate structure 12 are arranged orthogonally, but not limited thereto. When viewed in top view, the gate structures 12 are preferably stripe-shaped, and arranged parallel to each other, but not limited thereto. A plurality of source/drain regions (S/D regions) is disposed on two sides of the gate structure 12, and is preferably disposed in epitaxial layers 15 disposed on the fin structures 16. In this embodiment, the gate structure 12 preferably comprises metal materials, and the S/D regions can be formed on the fin structure 16 disposed at two sides of the gate structure 12. The method of the present invention further comprises forming a shallow trench isolation (STI) 17 on the substrate 10 to isolate the electric elements on the substrate 10 from each other. In this embodiment, some of the gate structures 12 cover and cross the fin structure 16 (such as the gate structure 12a shown in FIG. 2), and other of the gate structures 12 are directly disposed on the STI 17 (such as the gate structure 12b shown in FIG. 2). These gate structures 12b may be used as passing gates. Still other of the gate structures 12 are disposed on the distal ends of the fin structure 16 to protect the fin structure 16 from damage by the following process and may be used as dummy gates (such as the gate structure 12c shown in FIG. 2).

Afterwards, a spacer 18 and a contact etching stop layer (CESL) (not shown) may be formed on two sides of the gate structure 12. An interlayer dielectric (ILD) 22 is then formed on the substrate 10, and is disposed between each gate structure 12. Subsequently, a replacement metal gate (RMG) process is carried out. Through the RMG process, silicon-based gate structures can be replaced with metal based-gate structures. Then, a planarization process, such as a chemical mechanical polishing (CMP), is performed to have the top surface of the gate structure 12 aligned with the top surface of the ILD 22. Subsequently, a hard mask 24 is selectively formed and replaces the upper portion of each of the gate structures 12. Afterwards, another planarization process is performed to remove the extra hard mask 24 on the top surface of the ILD 22. In other words, the hard mask 24 is disposed only on the top portions of the gate structure 12, and the top surface of the hard mask 24 is aligned with the top surface of the ILD 22. Besides, since the hard mask 24 replaces portions of the gate metal 23 of the gate structures 12, the hard mask 24 is therefore disposed only on the gate metal 23 and between the spacers 18. In addition, since parts of the spacer 18 and parts of the CESL are removed during another planarization process, the spacer 18 and the CESL have a truncated top surface. In the present embodiment, the spacer 18, the CESL and the hard mask 24 are mainly made of silicon nitride, and the ILD 22 is mainly made of silicon oxide, but not limited thereto. These elements and the manufacturing methods thereof are well known to persons of ordinary skill in the art and the details will not be described here.

Afterwards, please refer to FIG. 2. Another ILD 26 and hard mask layer 27 are then formed on the ILD 22, and a first photoresist layer 28 is then formed on the hard mask layer 27. According to the preferred embodiment, the first photoresist layer 28 includes an organic dielectric layer (ODL) 28a, a silicon-containing hard mask bottom anti-reflecting coating (SHB) 28b and a photoresist (PR) layer 28c from bottom to top. In short, the first photoresist layer 28 is a tri-layered structure consisting of an ODL/SHB/PR structure, but not limited thereto. Afterwards, the mask patterns 108 of the modified design layout 100a shown in FIG. 1 are transferred to the first photoresist layer 28 during a suitable photolithographic process, and a region A is therefore defined in the photoresist layer 28c.

Figure 3:
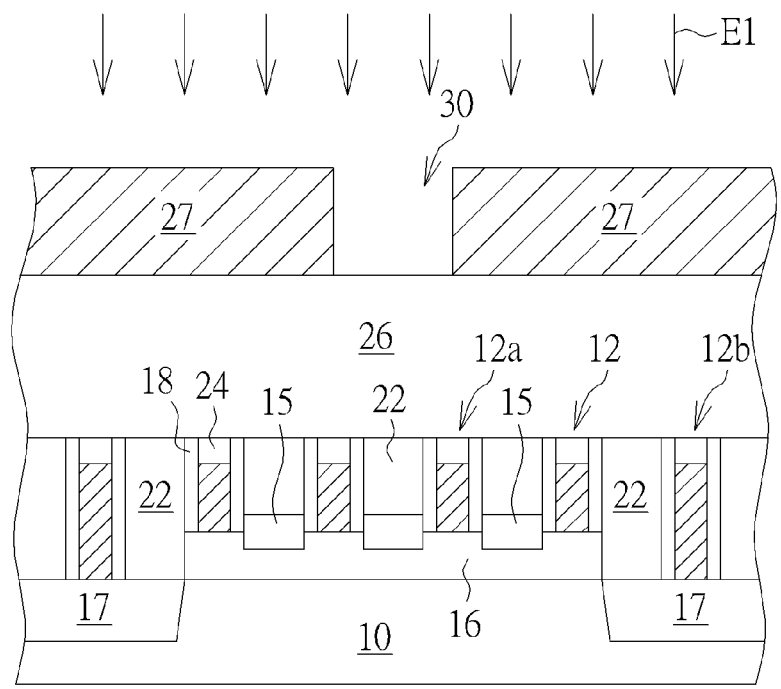
FIG. 3 is a schematic cross-section diagram of a semiconductor device at a processing stage following FIG. 2.

Afterwards, please refer to FIG. 3, at least an etching process E1 is performed to transfer the pattern in the first photoresist layer 28 to the underlying layer. In detail, the etching process E1 etches the SHB 28b, the ODL 28a and the hard mask layer 27 in sequence, until exposing the ILD 26. It is noteworthy that when viewed in cross section view, as shown in FIG. 3, an opening 30 or stripe hole is formed in the hard mask layer 27. The pattern in the hard mask layer 27 may be used to define the positions of slot contacts formed in the following process. Besides, portions of the hard mask layer 27 may have the shape of stripe when viewed from a top down perspective (as shown in the right side of FIG. 4). The etching process E1 of the present invention preferably uses etching gases, which may comprise per fluorocarbon gases, such as tetrafluoromethane ($CF_4$), fluoroform ($CHF_3$), hexafluorobutadiene ($C_4F_6$), and further comprises oxygen and argon, but not limited thereto. The etching process may also comprise a wet-etching process.

Figure 4:
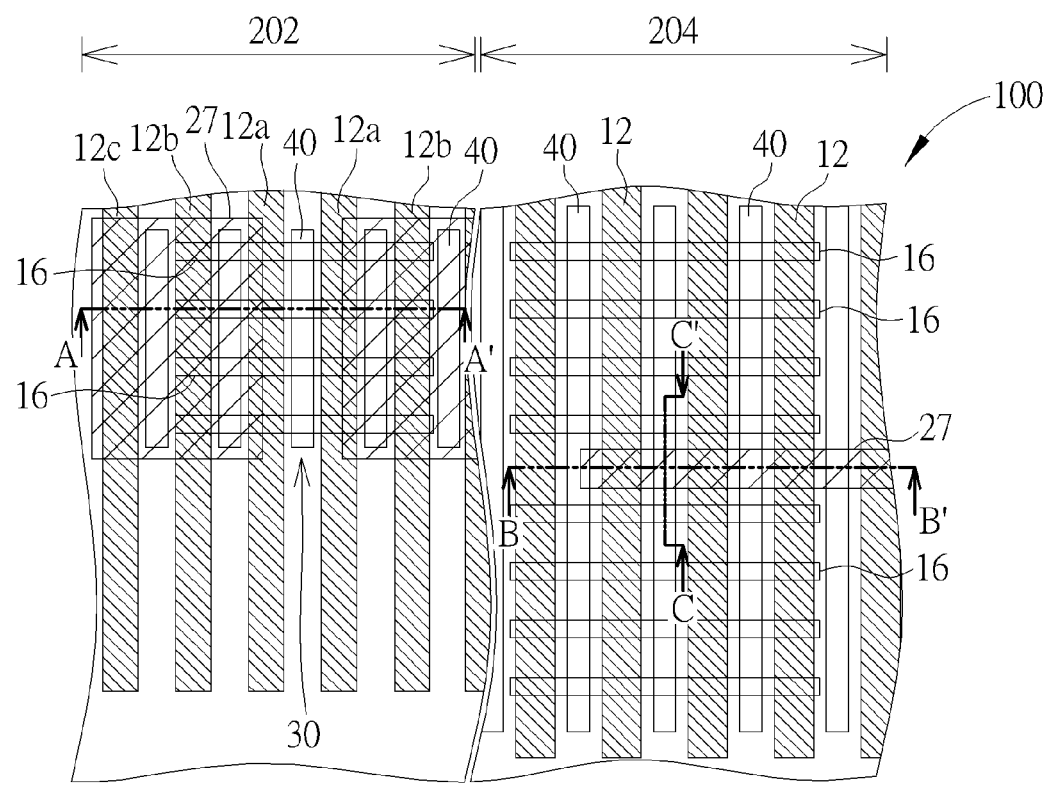
FIG. 4 is a schematic top view showing a patterned photoresist with a plurality of slot holes.
Figure 5:
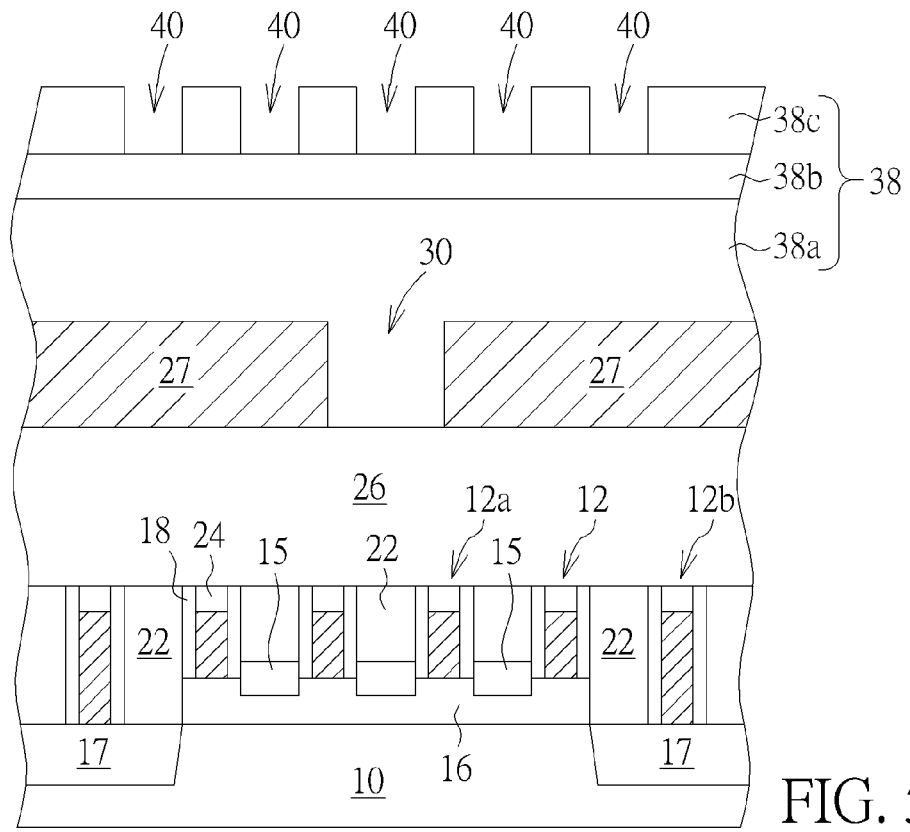
FIGS. 5 and 6 are schematic cross-section diagrams respectively taken along line A-A' and lines B-B' in FIG. 4.
Figure 6:
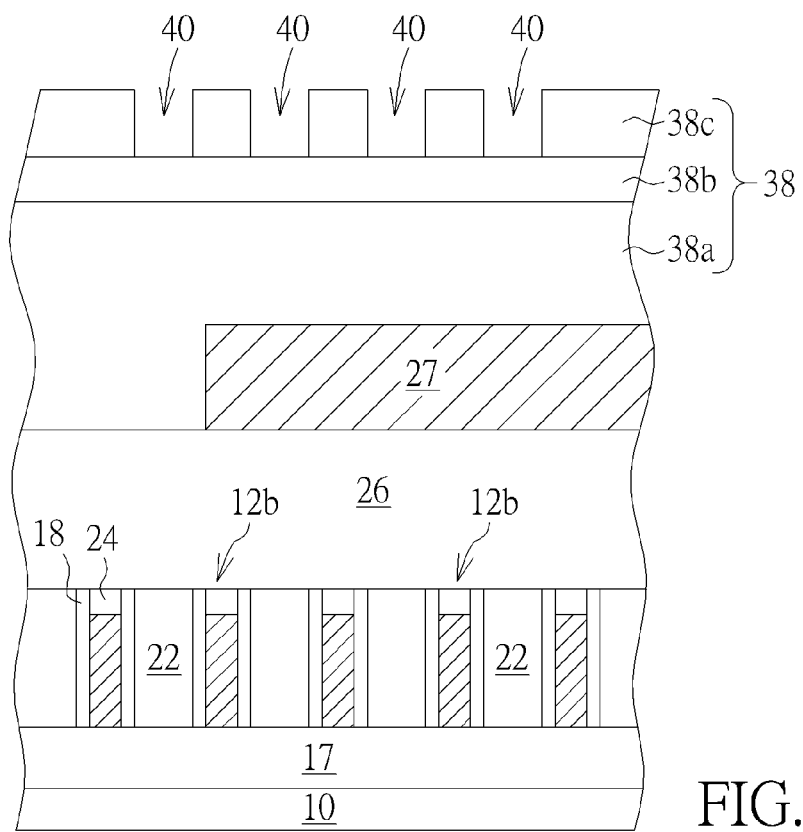

Afterwards, another photoresist layer is coated on the patterned hard mask layer 27. For example, a second photoresist layer is disposed on the ILD 26 and the patterned hard mask layer 27, wherein the material of the photoresist layer may be the same as the material of the first photoresist layer 28, comprising an organic dielectric layer (ODL), a silicon-containing hard mask bottom anti-reflecting coating (SHB) and a photoresist layer. Then, a suitable photolithographic process is carried out to transfer the slot contact patterns 112 shown in FIG. 1 to the photoresist layer. The corresponding structures are shown in FIGS. 4-6. FIG. 4 is a schematic top view showing a patterned photoresist with a plurality of slot holes. FIGS. 5 and 6 are schematic cross-section diagrams respectively taken along line A-A' and lines B-B' in FIG. 4. As shown in FIG. 4, a plurality of slot holes 40 are formed on a first region 202 and a second region 204 of the substrate 10. It should be noted that the design layouts of the structures within the first region 202 and the second region 204 are respectively defined by those shown in FIG. 1. In detail, as shown in FIGS. 5 and 6, a patterned photoresist layer 38 may include a patterned photoresist layer 38c with slot holes 40, a silicon-containing hard mask bottom anti-reflecting coating (SHB) 38b and an organic dielectric layer (ODL) 38a from top to bottom. It should be noted that the width of the slot holes 40 is preferably less than the size of the stripe hole 30 of the patterned hard mask layer 27. In addition, the position of the slot holes 40 may be disposed corresponding to the position of the space between two adjacent gate structures 12, but not limited thereto. Besides, referring to FIG. 4 and FIG. 5, at least one of the slot holes 40 in the first region 202 is laterally spaced apart from the patterned hard mask layer 27.

Figure 7:
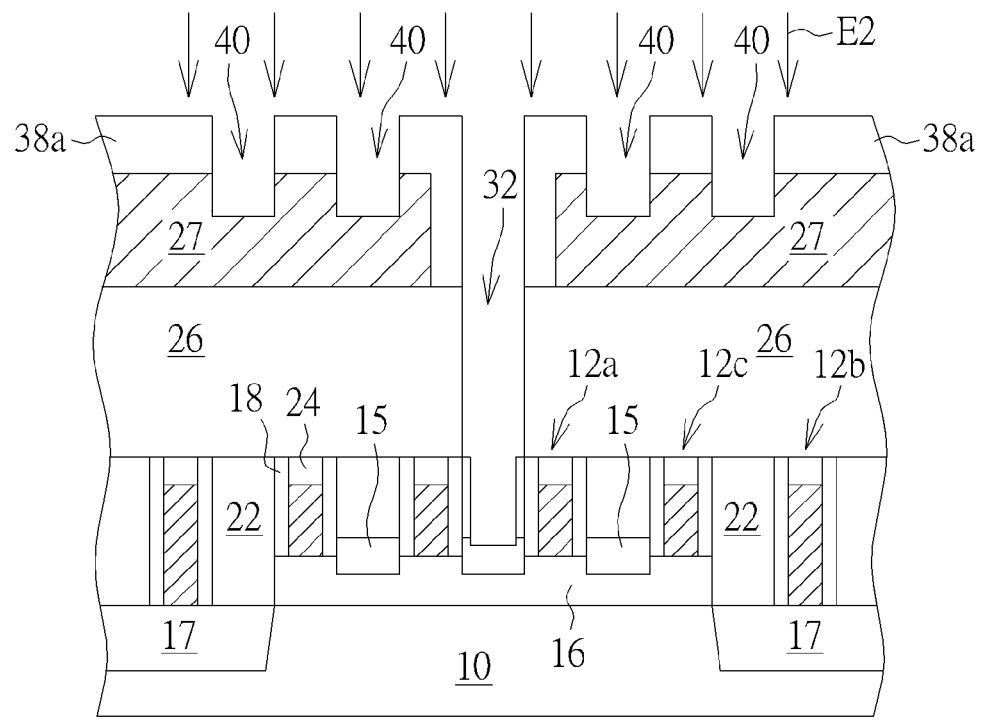
FIGS. 7-10 are schematic diagrams illustrating a manufacturing method of the semiconductor device according to a preferred embodiment of the present invention.

FIG. 7 is a schematic cross-section diagram corresponding to the structure taken along line A-A' in FIG. 4. As shown in FIG. 7, an etching process E2 is then performed by using the patterned photoresist layer 38 and the patterned hard mask layer 27 as etch masks. In detail, at the beginning of the etching process E2, the slot holes 40 defined in the patterned photoresist layer 38c are sequentially transferred to the underlying ODL 38a and patterned hard mask layer 27. Because the patterned hard mask layer 27 is made of materials with relatively low etching rate, such as titanium nitride or other suitable metal compounds, the patterned hard mask layer 27 exposed from the bottom of the patterned ODL 38a may only be slightly removed. In contrast, the ILD 26 and 22 not covered by the patterned hard mask layer 27 may be etched completely until the corresponding S/D regions or epitaxial layers 15 are exposed. As a result, at least a contact hole 32 is formed in the ILD 26 and 22. Besides, parts of the etched hard mask layer 27 still remain on the ILD 26. Similar to the etching process E1 mentioned above, the etching process E2 preferably uses etching gases, which may comprise per fluorocarbon gases, such as tetrafluoromethane ($CF_4$), fluoroform ($CHF_3$), hexafluorobutadiene ($C_4F_6$), and further comprises oxygen and argon, but not limited thereto. The etching process E2 may also comprise a wet-etching process.

It is noteworthy that the patterned photoresist layer 38c and the patterned hard mask layer 27 are used as an etch mask during the etching process E2. That is, only the layers not covered by the patterned photoresist layer 38c and the patterned hard mask layer 27 are etched. Therefore, each contact hole 32 is disposed between two adjacent gate structures 12 without contacting the gate structures 12 after the etching process E2. In addition, when viewed in top view, each contact hole 32 is stripe-shaped and arranged parallel to each gate structure 12.

Figure 8:
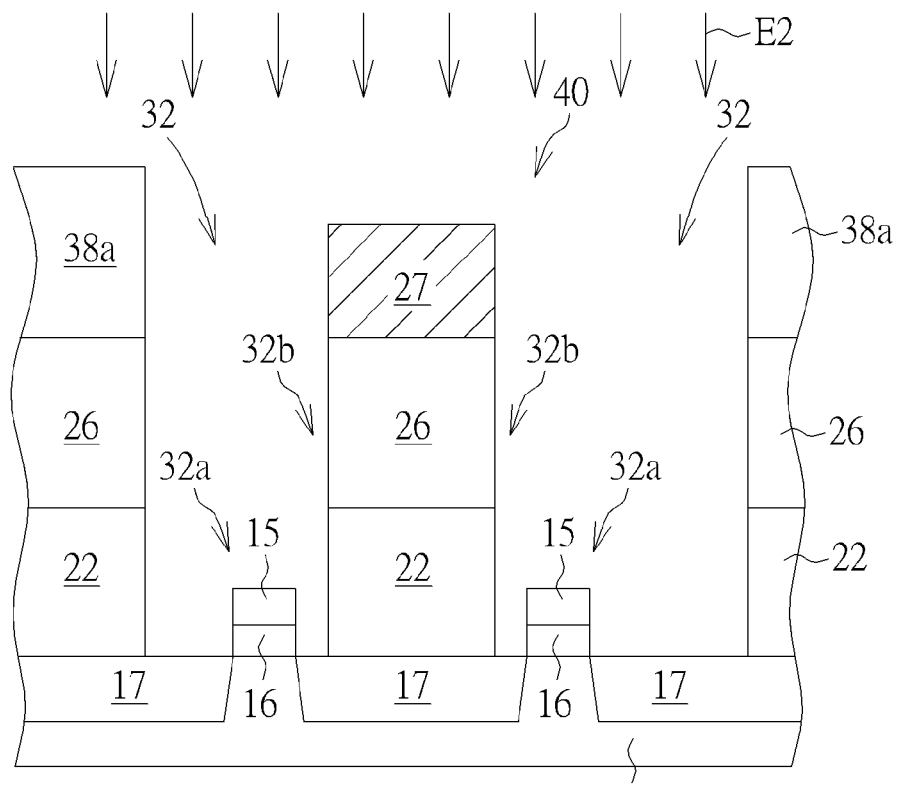

FIG. 8 is a schematic diagram showing a semiconductor device with contact holes taken along line C-C' in FIG. 4. The structure corresponds to the second region 204 of FIG. 4 after the above-mentioned etching process E2 is shown in FIG. 8. As can be seen in FIG. 8, because of the existence of the patterned hard mask layer 27, the entire pattern defined by the slot hole 40 may not be fully transferred down to the ILD 22. That is, only the ILD 22 not covered by the ODL 38a and the patterned hard mask layer 27 can be etched during the etching process E2. In detail, when the etching process E2 is completed, the epitaxial layers 15 may be respectively exposed from the bottom 32a of contact holes 32. Additionally, as shown in FIG. 8, the distal ends 32b of the two adjacent contact holes 32 are aligned with the sidewalls of the patterned hard mask layer 27.

Figure 9:
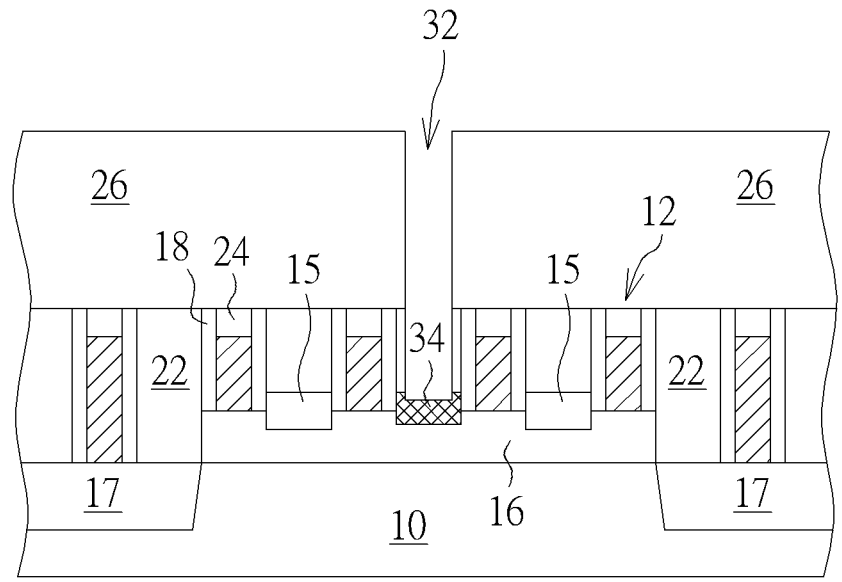

Then, the ODL 38a and the patterned hard mask layer 27 are then removed to expose the top surface of the ILD 26. Afterwards, as shown in FIG. 9, a self-aligned silicide (salicide) process is performed to thereby form a salicide layer 34 on the epitaxial layers 15 at the bottom of the contact holes 32. The salicide process includes the steps of filling a metal layer (not shown) in each contact hole 32, and performing an annealing process to form a salicide layer 34 on the interface between the metal layer and the epitaxial layers 15. Afterwards, the metal layer disposed in the contact holes 32 is then removed. It is noteworthy that the salicide layer 34 may be formed at the surface of the epitaxial layers 15, on the fin structure 16, on the epitaxial layer 15 or on the substrate 10, but it is preferably not formed on the STI 17.

Figure 10:
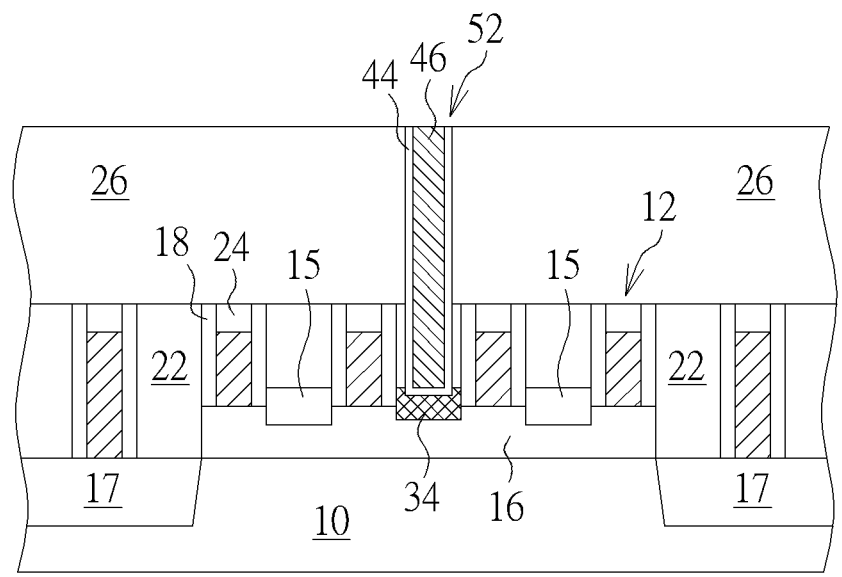

As shown in FIG. 10, a barrier layer 44 and a conductive layer 46 are filled in each trench 32 simultaneously, wherein the barrier layer 44 may comprise titanium nitride (TiN), tantalum nitride (TaN) or Ti/TiN multiple barrier layers to improve the adhesivity between the inner surface of each trench 32 and the conductive layer formed in the following steps. The conductive layer 46 preferably comprises tungsten (W) that has better gap fill performance. A planarization process is then performed to remove the extra barrier layer and the conductive layer disposed on the top surface of the ILD 26 to form a plurality of contact structures 52 in the ILD 22 and in the ILD 26. In addition, since the contact structures 52 is filled with the conductive layer 46, each contact structure 52 is a monolithically formed structure. FIG. 10 is the schematic diagram showing the top view structure of the semiconductor device after the contact structure 52 is formed. As shown in FIG. 9, because the contact hole 32 is formed between every two adjacent gate structures 12 without directly contacting the gate structure 12, the contact structure 52, which is obtained by filling up the contact hole 32 with the conductive layer 46, can also be spaced apart from the gate structures 12. It is noteworthy that since the top portion of each of the gate structures 12 is also protected by the hard mask layer 27, the step of forming the hard mask 24 mentioned above may be omitted. In other words, the hard mask 24 is selectively formed in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing contact structure electrically connecting a semiconductor device, the method comprising:

provinding a substrate having the semiconductor device and an interlayer dielectric thereon, wherein the semiconductor device comprises a gate structure and a source/drain region;

forming a patterned mask layer with a stripe hole on the substrate, wherein the stripe hole is disposed directly above the source/drain region;

forming a stripe-shaped mask layer on the substrate during the step of forming the patterned mask layer, wherein the stripe-shaped mask layer is spaced apart from the source/drain region and the patterned mask layer, and the stripe-shaped mask layer has the shape of stripe when viewed from a top down perspective;

forming a patterned photoresist layer with a plurality of slot holes on the substrate, wherein at least one of the slot holes is disposed directly above the source/drain region and wherein the longest side of each of the slot holes is parallel to the longest side of the stripe hole, and a width of the stripe hole is greater than a width of each slot hole; and forming a contact hole in the interlayer dielectric by using the patterned mask layer, the stripe-shaped mask layer and the patterned photoresist layer as an etch mask, wherein the source/drain region is exposed from the bottom of the contact hole when the step of forming the contact hole is completed.

2. The method of claim 1, wherein the patterned mask layer is made of a titanium nitride.

3. The method of claim 1, wherein the patterned photoresist layer has a multi-layered structure.

4. The method of claim 1, wherein at least one of the slot holes is disposed directly above the stripe hole.

5. The method of claim 1, wherein the step of forming the patterned mask layer comprises:
depositing a mask layer on the interlayer dielectric; and
patterning the mask layer to thereby form the patterned mask layer.

6. The method of claim 5, wherein the step of forming the patterned photoresist layer comprises:
coating a photoresist layer on the patterned mask layer; and
patterning the photoresist layer to thereby form the patterned photoresist layer.

7. The method of claim 1, wherein the patterned mask layer is partially exposed from the bottom of the slot holes after the step of forming the patterned photoresist layer.

8. The method of claim 1, further comprising filling a conductive material into the contact hole.

9. The method of claim 8, further comprising removing the patterned mask layer before the step of filling the conductive material into the contact hole.

10. The method of claim 1, further comprising removing the patterned mask layer after the step of forming the contact hole.

11. The method of claim 1, further comprising depositing another interlayer dielectric on the gate structure before the step of forming the stripe-shaped mask layer.

12. The method of claim 11, wherein the interlayer dielectric disposed on the gate structure is interposed between the gate structure and the stripe-shaped mask layer.

13. The method of claim 1, wherein at least one of the slot holes is laterally spaced apart from the patterned mask layer when the step of forming the patterned photoresist layer is completed.

14. A method for manufacturing contact structure electrically connecting a semiconductor device, the method comprising:
providing a substrate having an interlayer dielectric thereon;
forming a mask layer on the interlayer dielectric;
patterning the mask layer so as to concurrently form a patterned mask layer and a stripe-shaped mask layer, wherein the patterned mask layer comprises a stripe hole and is laterally spaced apart from the stripe-shaped mask layer;
forming a patterned photoresist layer having a plurality of slot holes on the patterned mask layer and the stripe-shaped mask layer, wherein the longest side of at least one of the slot holes is parallel to the longest side of the stripe hole and laterally spaced apart from the pattern mask layer, and at least another one of the slot holes crosses over the stripe-shaped mask layer; and
etching the interlayer dielectric by using the patterned mask layer, the stripe-shaped mask layer and the patterned photoresist layer as an etch mask so as to form a plurality of contact holes in the interlayer dielectric.

15. The method of claim 14, wherein the stripe-shaped mask layer has the shape of stripe when viewed from a top down perspective.

* * * * *